United States Patent
Huang et al.

(10) Patent No.: US 6,855,648 B2
(45) Date of Patent: Feb. 15, 2005

(54) METHOD OF REDUCING STRESS MIGRATION IN INTEGRATED CIRCUITS

(75) Inventors: Chen-Ming Huang, Taipei (TW); Sen-Shan Yang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 47 days.

(21) Appl. No.: 10/601,163

(22) Filed: Jun. 20, 2003

(65) Prior Publication Data

US 2004/0259376 A1 Dec. 23, 2004

(51) Int. Cl.[7] .............................................. H01L 21/324
(52) U.S. Cl. ....................................................... 438/795
(58) Field of Search ................................. 438/795, 923, 438/758, 663, 660

(56) References Cited

U.S. PATENT DOCUMENTS

| | | | |
|---|---|---|---|
| 5,166,095 A | * | 11/1992 | Hwang ........................ 438/660 |
| 6,258,220 B1 | | 7/2001 | Dordi et al. |
| 6,508,920 B1 | | 1/2003 | Ritzdorf et al. |
| 6,511,718 B1 | * | 1/2003 | Paz de Araujo et al. .... 427/576 |

* cited by examiner

*Primary Examiner*—Carl Whitehead, Jr.
*Assistant Examiner*—Monica D. Harrison
(74) *Attorney, Agent, or Firm*—Duane Morris LLP

(57) ABSTRACT

A method for reducing stress migration in the copper interconnect line is set forth. In accordance with the method, two anneal steps take place: The first step is at low temperature and of relatively short duration (e.g., about 25–300° C., and about 10 seconds–10 hours). After the first anneal, the wafer is cooled to room temperature. The second step is performed after the cooling step; a higher anneal temperature and longer time duration is needed to enhance performance.

15 Claims, No Drawings

METHOD OF REDUCING STRESS MIGRATION IN INTEGRATED CIRCUITS

BACKGROUND OF THE INVENTION

1. Field of the Invention

The present invention generally relates to the deposition of a metal layer onto a wafer/substrate. More particularly, the present invention relates to an electro-chemical deposition or electroplating system for forming a metal layer on a wafer/substrate.

2. Background Art

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates.

As circuit densities increase, the widths of vias, contacts and other features, as well as the dielectric materials between them, decrease to less than 250 nanometers, whereas the thickness of the dielectric layers remains substantially constant, with the result that the aspect ratios for the features, i.e., their height divided by width, increases. Many traditional deposition processes, such as physical vapor deposition (PVD) and chemical vapor deposition (CVD), have difficulty filling structures where the aspect ratio exceeds 4:1, and particularly where it exceeds 10:1. Therefore, there is a great amount of ongoing effort being directed at the formation of void-free, nanometer-sized features having high aspect ratios, wherein the ratio of feature height to feature width can be 4:1 or higher. Additionally, as the feature widths decrease, the device current remains constant or increases, which results in an increased current density in the feature.

Elemental aluminum (Al) and its alloys have been the traditional metals used to form lines and plugs in semiconductor processing because of aluminum's perceived low electrical resistivity, its superior adhesion to silicon dioxide ($SiO_2$), its ease of patterning, and the ability to obtain it in a highly pure form. However, aluminum has a higher electrical resistivity than other more conductive metals such as copper, and aluminum also can suffer from electromigration, leading to the formation of voids in the conductor.

Copper and its alloys have lower resistivities than aluminum and significantly higher electromigration resistance as compared to aluminum. These characteristics are important for supporting the higher current densities experienced at high levels of integration and increased device speed. Copper also has good thermal conductivity and is available in a highly pure state. Therefore, copper is becoming a choice metal for filling sub-quarter micron, high aspect ratio interconnect features on semiconductor substrates.

Despite the desirability of using copper for semiconductor device fabrication, choices of fabrication methods for depositing copper into very high aspect ratio features, such as a 4:1, having $0.35\mu$ (or less) wide vias are limited. As a result of these process limitations, plating, which had previously been limited to the fabrication of lines on circuit boards, is just now being used to fill vias and contacts on semiconductor devices.

Metal electroplating is generally known and can be achieved by a variety of techniques. A typical method generally comprises physical vapor depositing a barrier layer over the feature surfaces, physical vapor depositing a conductive metal seed layer, preferably copper, over the barrier layer, and then electroplating a conductive metal over the seed layer to fill the structure/feature. Finally, the deposited layers and the dielectric layers are planarized, such as by chemical mechanical polishing (CMP), to define a conductive interconnect feature.

SUMMARY OF THE INVENTION

A method for reducing stress migration in the copper interconnect line is set forth. In accordance with the method, two anneal steps take place: The first step is at low temperature and of relatively short duration (e.g., about 25–300° C., and about 10 seconds–10 hours). After the first anneal, the wafer is cooled to room temperature. The second step is performed after the cooling step; a higher anneal temperature and longer time duration is needed to enhance performance.

DESCRIPTION OF THE PREFERRED EMBODIMENTS

A typical copper deposition process includes the electroplating of copper, followed by an in-situ post electroplating copper anneal step, in order to stabilize the copper film, and allowing its removal by chemical-mechanical polishing. From a resistance point of view, the annealed copper is at a relatively stable state, with little, if any change in resistance. However, from a stress migration perspective, the treated copper is not stable and has inadequate stress migration stability. In accordance with the treatment of the present invention, an anneal process is provided that reduces the maximum resistance increment from about 17% to about 8%.

By "maximum resistance increment," it is meant that in a formal stress migration qualification, one particular sample size is required, and a criteria is also defined to judge the result of stress migration qualification. For example, a qualification is defined as needing to have at least 300 samples, and the pass criteria is no sample larger than 10% via resistance after 175° C./1000 hours baking. Therefore, the resistance increment is used to judge the performance of stress migration. The resistance increment is defined as (Via-Rc after 175° C./1000 hours baking—initial Rc)/initial Rc.

The multi-anneal process of the present invention includes the following steps: The first step is at low temperature and of relatively short anneal duration (e.g., about 25–300° C., 100–300° C. preferred, and about 10 seconds–10 hours, 10–1000 seconds preferred). After the first anneal, the wafer is cooled to room temperature. The second step is performed after the cooling step; both a higher anneal temperature and longer time duration (as compared to the first step) are needed in order to enhance performance, with a temperature of about 50–400° C. (200–400° C. preferred) and a time duration of about 1 minute–10 hours (1–15 minutes preferred) considered acceptable.

While this invention has been described with respect to particular embodiments thereof, it is apparent that numerous other forms and modifications of this invention will be obvious to those skilled in the art. The appended claims in this invention generally should be construed to cover all such obvious forms and modifications which are within the true spirit and scope of the present invention.

What is claimed is:

1. A method for reducing stress migration in recessed microstructures of a microelectronic wafer comprising the steps of:
    subjecting the wafer to a first annealing treatment at 25–300° C.;
    cooling the wafer to room temperature; and
    subjecting the wafer to a second annealing treatment at 50–400° C.

2. The method as recited in claim 1, wherein the temperature of the first annealing treatment is from about 100–300° C.

3. The method as recited in claim 1, wherein the temperature of the second annealing treatment is from about 200–400° C.

4. The method as recited in claim 1, wherein the temperature of the second annealing treatment is greater than the temperature of the first annealing treatment.

5. The method as recited in claim 1, wherein the time duration of the second annealing treatment is greater than that of the first annealing treatment.

6. A method for reducing stress migration in recessed microstructures of a microelectronic wafer comprising the steps of:
    subjecting the wafer to a first annealing treatment at 25–300° C. for from about 10 seconds to about 10 hours;
    cooling the wafer to room temperature; and
    subjecting the wafer to a second annealing treatment at 50–400° C.

7. The method as recited in claim 6, wherein the temperature of the first annealing treatment is from about 100–300° C.

8. The method as recited in claim 6, wherein the temperature of the second annealing treatment is from about 200–400° C.

9. The method as recited in claim 6, wherein the temperature of the second annealing treatment is greater than the temperature of the first annealing treatment.

10. The method as recited in claim 6, wherein the time duration of the second annealing treatment is greater than that of the first annealing treatment.

11. A method for reducing stress migration in recessed microstructures of a microelectronic wafer comprising the steps of:
    subjecting the wafer to a first annealing treatment at 25–300° C. for from about 10–1000 seconds;
    cooling the wafer to room temperature; and
    subjecting the wafer to a second annealing treatment at 50–400° C.

12. The method as recited in claim 11, wherein the temperature of the first annealing treatment is from about 100–300° C.

13. The method as recited in claim 11, wherein the temperature of the second annealing treatment is from about 200–400° C.

14. The method as recited in claim 11, wherein the temperature of the second annealing treatment is greater than the temperature of the first annealing treatment.

15. The method as recited in claim 11, wherein the time duration of the second annealing treatment is greater than that of the first annealing treatment.

* * * * *